United States Patent
Kato et al.

(10) Patent No.: US 6,629,850 B2
(45) Date of Patent: Oct. 7, 2003

(54) ELECTRICAL CONNECTION BOX FOR A VEHICLE

(75) Inventors: Shinshu Kato, Yokkaichi (JP); Eriko Yuasa, Yokkaichi (JP)

(73) Assignee: Sumitomo Wiring Systems, Ltd., Mie (JP)

( * ) Notice: Subject to any disclaimer, the term of this patent is extended or adjusted under 35 U.S.C. 154(b) by 0 days.

(21) Appl. No.: 10/012,513

(22) Filed: Dec. 12, 2001

(65) Prior Publication Data

US 2002/0072257 A1 Jun. 13, 2002

(30) Foreign Application Priority Data

Dec. 12, 2000 (JP) .......................................... 2000-376872

(51) Int. Cl.[7] .............................................. H01R 12/00
(52) U.S. Cl. ........................ 439/76.2; 439/732; 439/949
(58) Field of Search .................................. 439/76.2, 933, 439/701, 110, 212, 12, 214, 262, 732, 949

(56) References Cited

U.S. PATENT DOCUMENTS 5,941,719 A * 8/1999 Hayakawa ................... 439/206
6,220,875 B1 * 4/2001 Kawakita .................... 439/76.2
6,478,585 B2 * 11/2002 Yuasa et al. ................. 439/76.2

FOREIGN PATENT DOCUMENTS

| JP | 63-63022 U | 4/1988 |
|----|------------|--------|
| JP | 1-93913 U | 6/1989 |
| JP | A 6-70427 | 3/1994 |

* cited by examiner

Primary Examiner—Tho D. Ta
Assistant Examiner—James R. Harvey
(74) Attorney, Agent, or Firm—Oliff & Berridge, PLC

(57) ABSTRACT

An electrical connection box for a vehicle has a low-voltage bus bar and a high voltage bus bar, received in groove structures of a first insulation plate. Each groove structure is defined by a base wall surface on which the bus bar is disposed and a pair of opposed upstanding side wall surfaces. The first insulation plate has a downward recess or through-hole between the groove structures. A second insulation plate superimposed on the first plate has a downward projection received in the recess or through-hole and extending to a lower end which is below the base wall surfaces of the groove structures. The structure inhibits leak currents between the bus bars.

16 Claims, 6 Drawing Sheets

ELECTRICAL CONNECTION BOX FOR A VEHICLE

BACKGROUND OF THE INVENTION

1. Field of Invention

The present invention relates to an electrical connection box suitable for mounting on a vehicle, such as an automobile, and is adapted to have a relatively high voltage applied to it. The invention also relates to a vehicle including such an electrical connection box.

2. Description of Related Art

Normally one secondary, i.e. rechargeable, battery having a rated voltage of 12V and a maximum nominal voltage of 14V is mounted on an automobile of the internal combustion engine type. A voltage up to a maximum of 14V is applied from the battery to a circuit composed of bus bars and the like accommodated in an electrical connection box. The power supply is distributed by the internal circuit of the electrical connection box. The operation of electric/electronic component parts mounted on the vehicle is controlled through electric wires connected with the internal circuit. On a goods vehicle, such as a lorry or truck, a rated voltage of 24V and a maximum voltage of 28V may be applied to a circuit, by a battery structure.

In recent years, electric/electronic component parts have been mounted in increasing numbers on a vehicle, and there is an increase in the electric current which is applied to one electric/electronic component part. For example, the electric power required to drive a fan has conventionally been 130 watts, but has risen to 260 watts for some fans in recent years. For a battery having a rated voltage of 12V, it is impossible to operate suction and exhaust devices of an engine, an electromotive power steering, and like devices, requiring a high voltage such as 36V. Therefore, these devices are usually mechanically operated by the driving force of the engine.

With the increase of the electric current applied to each electric/electronic component part, the diameter of the electric wires used with each component part has increased. Further, with the rapid increase in the number of electric/electronic component parts, the number of electric wires has increased recently, which has increased the diameter of a wire harness comprising a bundle of these electric wires. Consequently, the weight of the electric wires to be wired on a vehicle body has increased.

As described above, if the power supply from the battery is incapable of operating the suction and exhaust devices of the engine, they are usually mechanically operated. In this case, it is impossible to accomplish fine control of the operation of the suction and exhaust devices. Further much fuel is consumed, which pollutes the environment. Accordingly, it is preferable to operate the suction and exhaust devices of the engine and the like not mechanically, but electrically by the power supply from the battery.

In the case where the circuit is so constructed that a voltage higher than 14V can be applied to the circuit of the electrical connection box composed of bus bars and the like, it is possible to reduce the required electric current. Thus, the diameter of the electric wires and the size of a bundle of a plurality of electric wires (wire harness) may also be reduced. Therefore, it is possible to also reduce the weight of the electric wires.

Further, with the application of a high voltage to the circuit composed of bus bars and the like, it is possible to control the operation of the suction and exhaust devices, the power steering motor and other such devices electrically, in lieu of mechanically or hydraulically. In this case, it is possible to accomplish fine control of the operation of suction and exhaust devices and the like. Further, fuel consumption can be reduced, which reduces pollution.

It is preferable to apply a high voltage of about 42V to the electromotive power steering motor, the suction and exhaust devices of the engine, the fan and other devices requiring a high voltage. On the other hand, in an automobile, it is preferable to apply the rated voltage of 12V (maximum voltage: 14V) to signal-generating devices of the electric/electrical components parts and coils of relays.

However, if the electrical connection box for distributing the power supply is provided with a circuit to which a low voltage up to a maximum of 14V (28V in a truck) is applied and with a circuit to which a high voltage of about 42V is applied, a leak current is liable to be generated between the two circuits owing to the potential difference. Such a leak current may occur particularly if water or dirt enters the electrical connection box. The leak current is also liable to be generated in a circuit to which a high voltage of about 42V is applied.

A leak current is liable to be generated between adjacent bus bars in the connection box, if the distance between the bus bars is short. For instance, in the case where a high voltage is applied to one of two adjacent bus bars while a low voltage is applied to the other or in the case where two adjacent bus bars are in a circuit to which a high voltage is applied.

JP-A-6-70427 illustrates an electrical connection box in which bus bars on an insulation plate are insulated from each other by upstanding partition walls. Between the adjacent partition walls the walls of the next insulation plate above are projected downward to improve insulation in the event of water penetration.

SUMMARY OF THE INVENTION

The present invention mitigates the problem of leak currents in the connection box described above. Therefore, it is an object of the present invention to prevent generation of leak currents in an electrical connection box, particularly a connection box which is provided with a circuit to which a low voltage and a high voltage is applied, or a circuit to which a high voltage is applied.

According to one exemplary embodiment of the present invention an electrical connection box is provided having a first bus bar to which a first voltage is applied during use and a second bus bar to which a second voltage not lower than the first voltage and not more than 200V is applied during use. The electrical connection box also has a first insulation plate on which both the first and second bus bars are mounted and a second insulation plate superimposed on the first insulation plate.

The first insulation plate provides, at least at a region where the first and second bus bars are adjacent, groove structures in which the first and second bus bars are respectively received. Each groove structure is defined by a base wall surface on which the respective bus bar is disposed and a pair of opposed upstanding side wall surfaces. The first insulation plate further provides a concavity in the form of a downward recess or a throughhole located between the groove structures. The second insulation plate has a downward projection received in the concavity, the downward projection having a lower end which is located at a level lower than the base wall surface of the groove structures.

The invention is applicable for example when the first voltage (low voltage) is 14V or 28V, e.g. the nominal maximum voltage rating of a battery, and the second voltage (high voltage) is up to 200V, e.g. 42V.

In one embodiment of the present invention, a low-voltage bus bar and a high-voltage bus bar are adjacently disposed on the first insulation plate, or two high-voltage bus bars are adjacently disposed thereon, and the bus bars are shielded by the insulation material between the groove structures. Thus it is possible to prevent or minimize the generation of leak currents. The downward projection of the second insulation plate formed of insulation material lies between the groove structures in the recess or through-hole and projects downward to a position lower than the bottom surface of the bus bars.

The height of the upper insulation plate above the lower plate can be fixed by the engagement of the plates to form an air insulation zone in each groove structure above the bus bar. Thus air insulation is possible. In this case, even though different voltage bus bars are adjacently disposed or two high-voltage bus bars are adjacently disposed, the air insulation zones are partitioned by the downward projection of the upper insulation plate. This helps to prevent leak currents from being generated between the bus bars. The groove structure may be closed by the upper insulation plate to form a closed air insulation zone.

In a first embodiment, the groove structure is provided by upstanding walls on the first insulation plate. In a second embodiment, the groove structure is provided by a groove in a main face of the first insulation plate. In the latter case, the bus bars, at least where they are adjacent to each other, may be bent to provide downward stepped portions disposed on lower bottom surface portions of the grooves.

It is preferable that the high voltage to be applied to the second (high-voltage) bus bar is about 42V. This is partly because it is easy to obtain a maximum nominal voltage of 42V by connecting in series three batteries each having a rated voltage of 12V (nominal maximum voltage: 14V) of the type conventionally used in an automobile. It is also possible to use a single battery having a maximum voltage of 42V. A maximum voltage of 42V is also preferable because using a voltage close to 50V or above for the high-voltage bus bar is possibly dangerous.

The present applicants have conducted salt water experiments in order to ascertain the degree of risk when applying a voltage of 42V in an electrical junction box suitable for use in an automobile engine compartment, as follows:

1 ml of salt water was injected into each terminal hole of the casing of a junction box which had bus bars disposed inside. Electrical components such as a relay, fuse and connectors etc. were mounted on the casing. A voltage of 42V was applied to the bus bars of the junction box for 8 hours and suspended for 16 hours. This was repeated twice. There was initially no change to the bus bars and electrical components. After the third repetition, it was found that extra electric current passed between the bus bars generating heat and a portion of the bus bars melted. The heat also melted resin around bus bars such as an insulation plate, casing and resin portion of electrical components adjacent to the casing. Accordingly, since damage did not occur until after the third exposure to salt water, it was confirmed that in consideration of conditions under normal use of an automobile, the application of the electric power at 42V to the electric/electronic component parts should not cause a problem.

BRIEF DESCRIPTION OF THE DRAWINGS

Exemplary embodiments of the invention will be described with reference to the accompanying drawings, in which like elements are labeled with like numbers and in which.

DETAILED DESCRIPTION OF PREFERRED EMBODIMENTS

Figure 1:
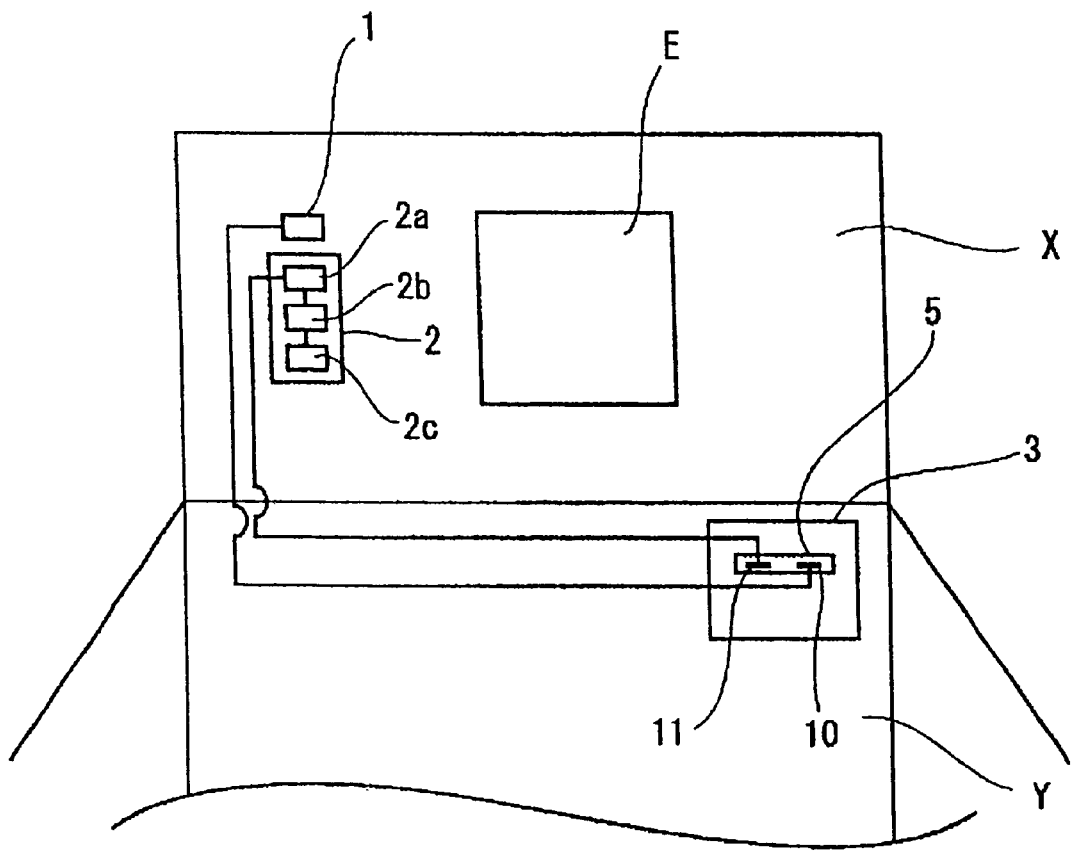
FIG. 1 is a diagrammatic view showing an embodiment of the present invention.

As schematically shown in FIG. 1, in an automobile to which the present invention is applied, an engine E mounted in an engine compartment X is arranged to drive the automobile and generate electrical power, e.g. through a conventional alternator, not shown. A low-voltage battery structure 1 and a high-voltage battery structure 2 are mounted in the engine compartment X. The low-voltage battery structure 1 may include a conventional general-purpose battery having a rated voltage of 12V and a maximum voltage of about 14V. The high-voltage battery structure 2 may include three such batteries 2a, 2b, and 2c connected in series to generate a maximum voltage of about 42V. Each of the three batteries 2a, 2b, and 2c has the rated voltage of 12V. It is also possible to use a single battery having a maximum voltage of about 42V.

The low-voltage battery structure 1 is connected to a low-voltage bus bar 10 accommodated in an electrical connection box 3 (electrical junction box) mounted in the passenger compartment Y (or, depending on the vehicle design, in the engine compartment X) to apply a low voltage (nominal maximum voltage: 14V) to the low-voltage bus bar 10. The high-voltage battery structure 2 is connected to a high-voltage bus bar 11 accommodated in the electrical connection box 3 to apply a high voltage (nominal maximum voltage: 42V) to the high-voltage bus bar 11.

Figure 2A:
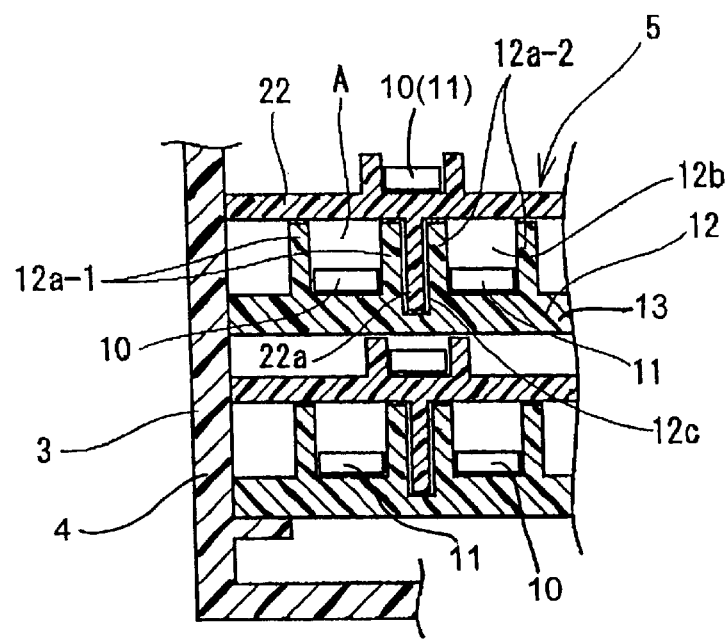
FIG. 2A is a schematic partial sectional view of the electrical connection box shown in FIG. 1.
Figure 2B:
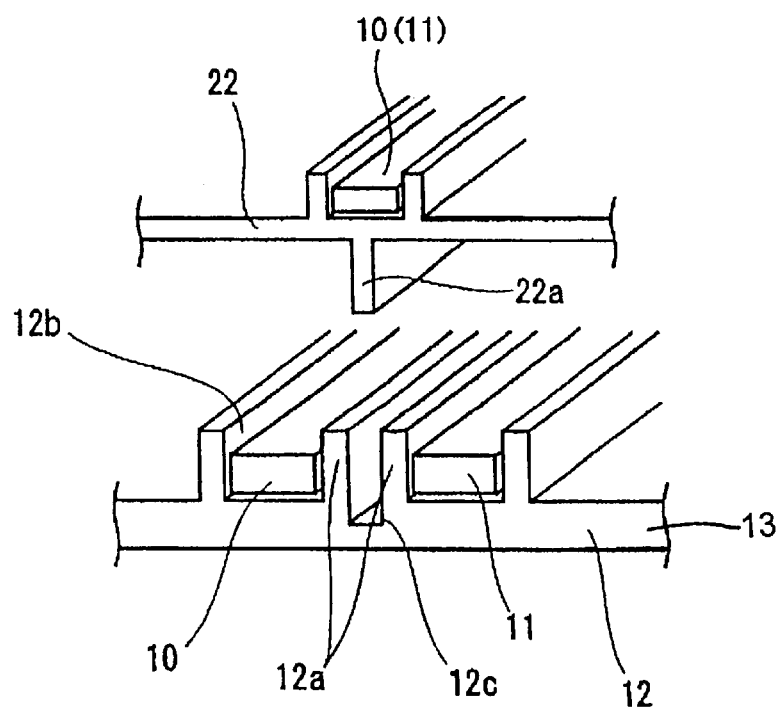
FIG. 2B is an exploded perspective view of part of the box of FIG. 2A.

As shown in FIG. 2A and 2B, the electrical connection box 3 of FIG. 1 has a molded plastics case 4 in which is mounted a circuit 5 in the form of a plurality of superimposed insulation plates 12 and 22 molded of a suitable plastics insulating material. The plates 12 and 22 carry the bus bars 10 and 11.

As shown in FIGS. 2A and 2B, guide walls 12a in pairs 12a-1, 12a-2 project upwardly from the insulation plate 12 where the low-voltage bus bars 10 and the high-voltage bus bars 11 are disposed, forming U-shaped grooves 12b between each adjacent pair of the guide walls 12a. The bus bars 10 and 11 are inserted into the grooves 12b respectively and fixed to the bottom thereof. The height of the guide walls 12a is larger than the thickness of the bus bars 10 and 11. The guide walls 12a are integrally formed with the planar body portion 13 of the plate 12.

In the region where the low-voltage bus bar 10 and the high-voltage bus bar 11 are disposed closely adjacent to one another, a recess 12c is formed between a guide wall 12a-1 for the high-voltage bus bar and an adjacent guide wall 12a-2 for the low-voltage bus bar. A projecting wall 22a extends downward from the next upper insulation plate 22 and is received in the recess 12c. The bottom surface of the recess 12c is at a level lower than the upper surface of the planar plate portion 13 of the insulation plate 12. Therefore, with the lower end of the wall 22a in contact with the bottom surface of the recess 12c, the bottom surface of the recess 12c is positioned lower than the upper surface of the planar plate portion 13, and thus lower than the bus bars 10 and 11 disposed on the bottom surfaces of the grooves 12b. The upper insulation plate 22 is mounted so that its lower surface contacts the upper surface of the guide walls 12a to form air insulation spaces A surrounded by the guide walls 12a, the upper insulation plate 22 and the upper surface of the bus bar 10 or 11.

As described above, in the portion of the circuit 5 in the electrical connection box 3, in which the low-voltage bus bar 10 and the high-voltage bus bar 11 are adjacently disposed, the double guide walls 12a and the projection 22a which is fitted in the recess 12c disposed between the double guide walls 12a are interposed between the bus bar 10 and the bus bar 11. Further, the projection 22a of the upper insulation plate 22, which is fitted in the recess 12c, extends below the position of the bus bars 10 and 11. Thus the distance between the bus bars 10 and 11 is great, which prevents the generation of leak current. Further, the upper surface of each of the opposed guide walls 12a accommodating the bus bars 10 and 11 is closed with the insulation plate 22 to form the air insulation zone A. Thus it is possible to minimize the risk of a leak current being generated between the bus bars 10 and 11. By the interdigitation of the walls 12a and 22a with the lower end of the downward wall 22a below the bus bars 10 and 11, the leak path between the bus bars 10 and 11 is increased, which helps to prevent the generation of a leak current. As FIGS. 2 and 3 also indicate, the upper insulation plate 22 may carry a bus bar or bus bars, located between upstanding walls. FIG. 2 shows how a plurality of pairs of plates 12 and 22 are stacked together.

Figure 3:
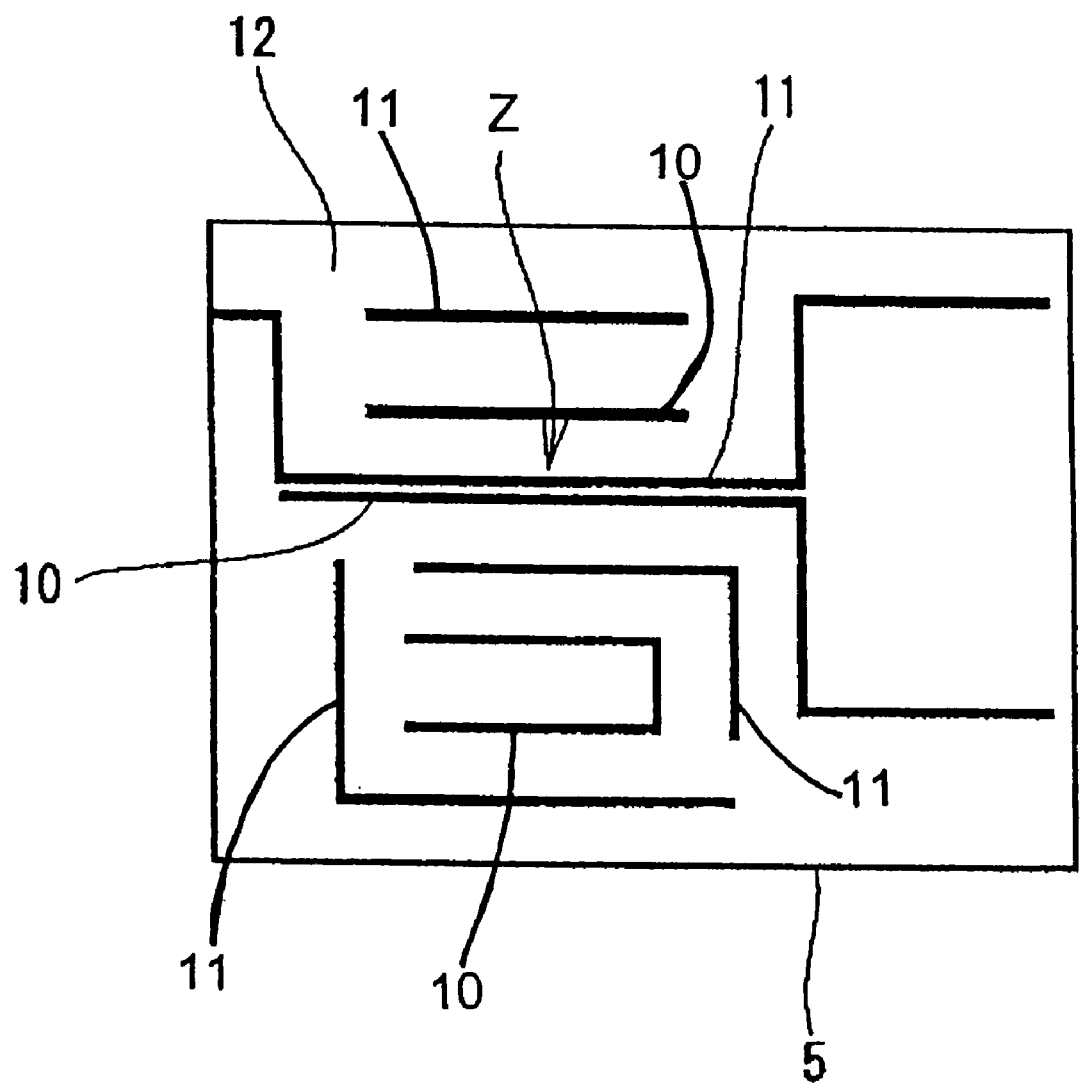
FIG. 3 is a schematic view showing how bus bars may be disposed on an insulation plate.

As shown in FIG. 3, there are low-voltage voltage bus bars 10 and high-voltage bus bars 11 both disposed on the same insulation plate 12. The low-voltage bus bars 10 and the high-voltage bus bars 11 are not segregated but are disposed at random to enhance efficiency in the designing of the circuit. For example the low-voltage bus bars 10 are not collected at one side with the high-voltage bus bars 11 collected at the other side. As shown in FIG. 3, one low-voltage bus bar 10 and one high-voltage bus bar 11 are disposed closely adjacent in a central portion Z of the plate 12.

Figure 4A:
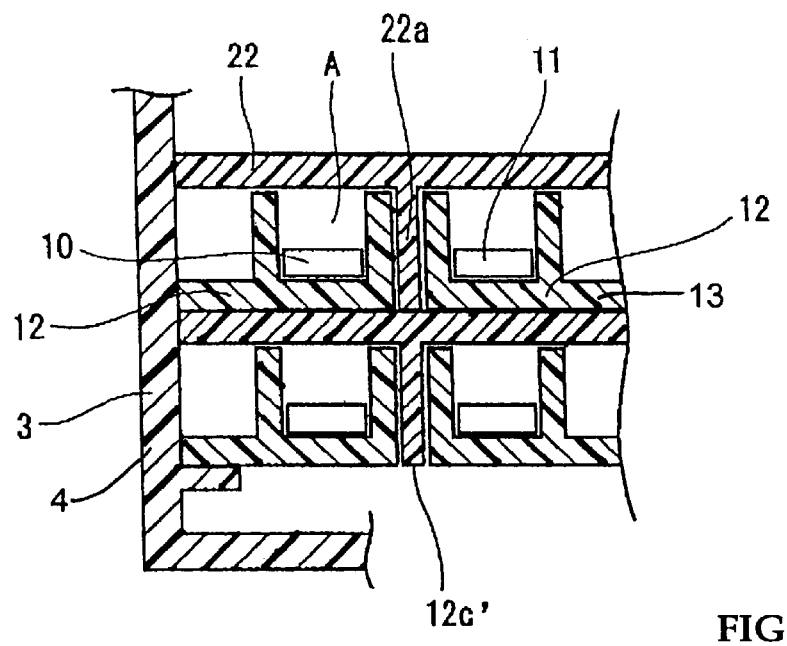
FIG. 4A is a schematic partial sectional view of another embodiment of an electrical connection box of this invention.
Figure 4B:
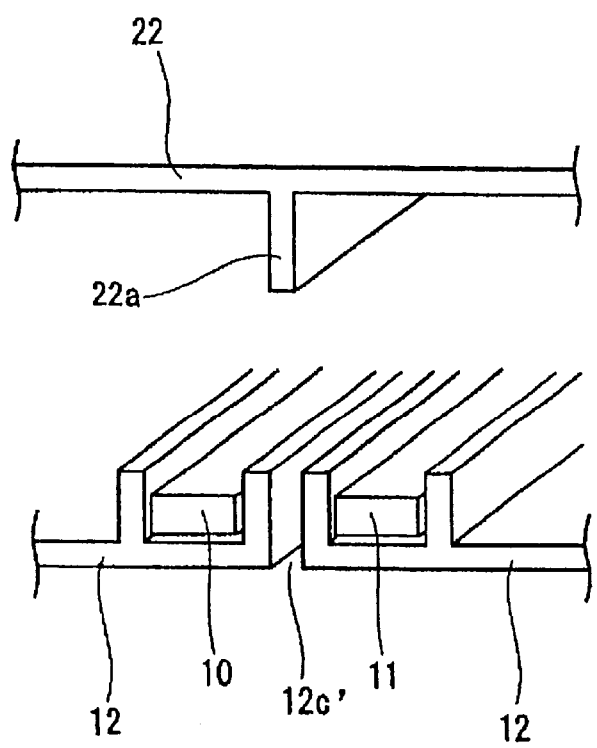
FIG. 4B is an exploded perspective view of part of the box of FIG. 4A.

FIGS. 4A and 4B show another exemplary embodiment of the apparatus of this invention differing from the previous embodiment in that instead of providing the recess 12c between one of the guide walls 12a-1, accommodating the low-voltage bus bar 10 and adjacent guide wall 12a-2 accommodating the high-voltage bus bar 11, a through-hole 12c' is formed at this location in the planar plate portion 13 of the plate 12. The downwardly projecting wall 22a of the upper insulation plate 22 extends to the lower end of the hole 12c'. Similarly to the previous embodiment, this construction securely prevents leak current from being generated between the bus bars 10 and 11.

Figure 5:
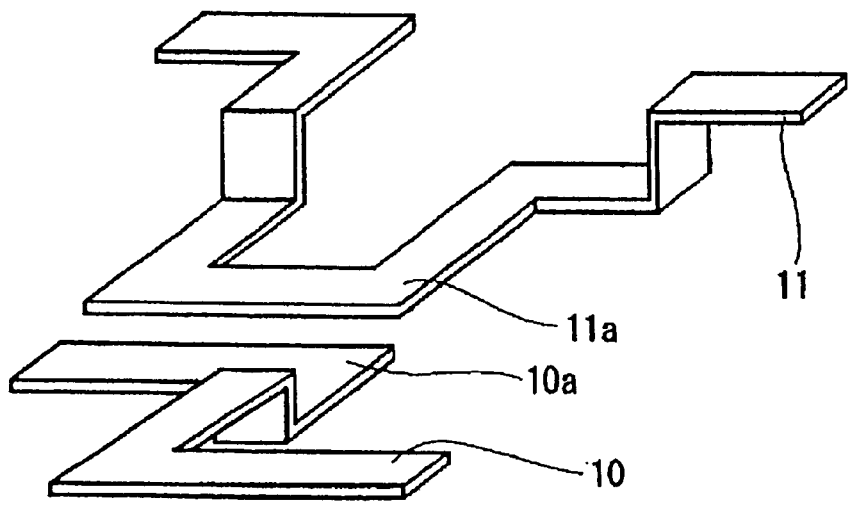
FIG. 5 is a schematic view of bus bars of another embodiment of the present invention.
Figure 6:
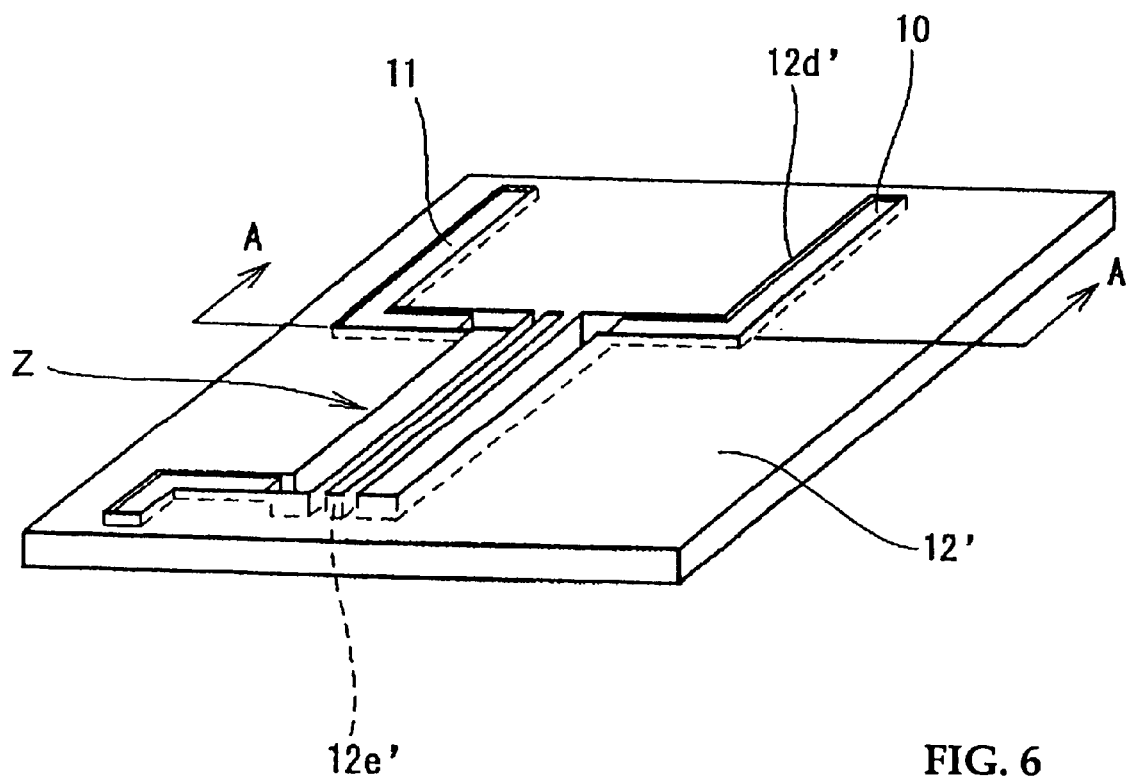
FIG. 6 is a perspective view showing how the bus bars of FIG. 5 are disposed on an insulation plate.
Figure 7:
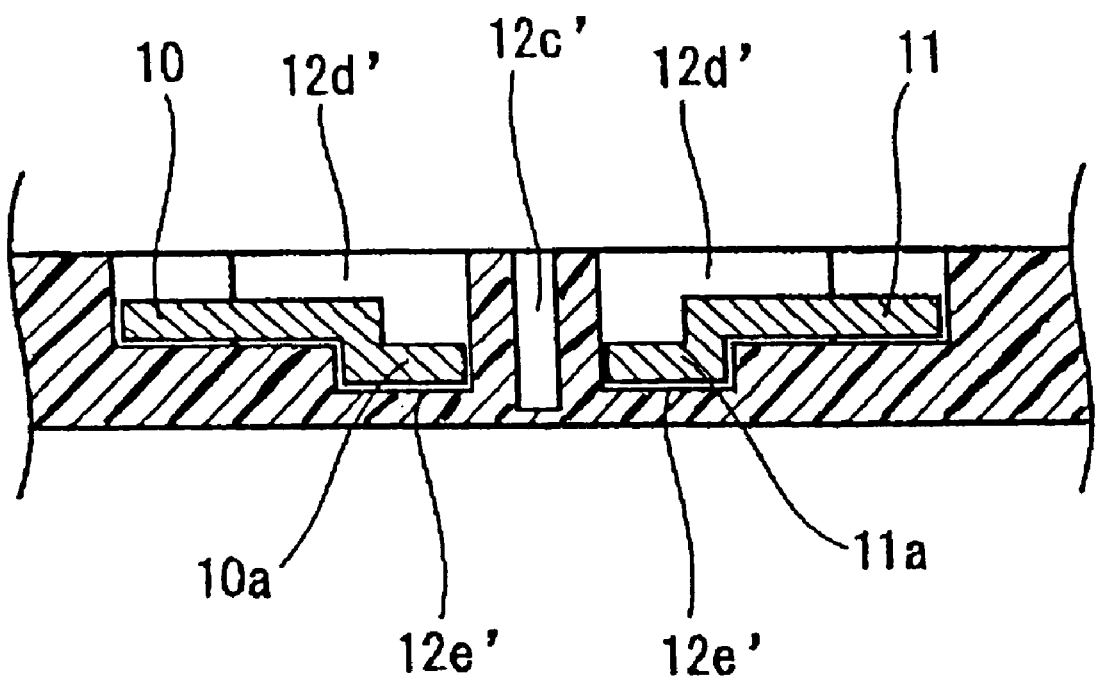
FIG. 7 is a sectional view taken along a line A—A of FIG. 6.

In another exemplary embodiment as illustrated in FIGS. 5 to 7, at a region where one of the low-voltage bus bars 10 and one of the high-voltage bus bars 11 are adjacently disposed, the bus bars 10 and 11 are bent to form downwardly stepped bent portions 10a and 11a respectively. The stepped bent portions 10a and 11a are arranged on the insulation plate 12' and located at a level below other portions of the low-voltage bus bar 10 and the high-voltage bus bar 11 that are not adjacent to each other. The insulation plate 12' has U-shaped grooves 12d to receive the bus bars 10 and 11. In the region where the bus bars 10 and 11 are closely adjacent, the groove 12d' has deeper portions 12e', at which the downwardly stepped bent portions 10a and 11a of the bus bars 10 and 11 lie.

A through-hole 12c' is formed in the plate 12' between the adjacent deeper groove portions 12e', and, as in FIGS. 2 and 3, a downwardly projecting wall of the next upper insulation plate (not shown in FIGS. 5 to 7) is inserted into the through-hole 12c'. The grooves 12d' are closed by the next upper insulation plate to form air insulation layers at the space above the bus bars 10 and 11 disposed in the grooves 12d'. In this way it is also possible to minimize risk of leak current being generated between the bus bars 10 and 11.

In these embodiments, there are shown arrangements where a high-voltage bus bar and a low-voltage bus bar are closely adjacent to one another. In the same manner the invention can be applied to an electrical connection box which has two high voltage bus bars adjacently disposed, to prevent current leakage between them. The construction in such a case is similar to that of the illustrated embodiments.

The circuits shown in these embodiments may be applied to a motor car on which the battery of the low voltage circuit has a rated voltage of 12V. The invention may likewise be applied in a motor car or a truck, where a bus bar to which a voltage of about 28V is applied is the low-voltage bus bar and a bus bar to which a voltage of about 42V is applied is the high-voltage bus bar. The same construction of the circuit 5 may be used in this case. In the embodiments, a maximum voltage of 42V is applied to the high-voltage bus bar 11. However, a high voltage of e.g. 42V–200V can be applied to the high-voltage bus bars 11, provided that safety is ensured.

As apparent from the foregoing description, by the present invention, a high voltage can be applied to a bus bar accommodated in an electrical connection box, so that it is possible to reduce the diameter of electric wires and the size of a wire harness by reducing the amount of electric current. When bus bars are adjacently disposed to which different voltages are applied, they are shielded within the groove structures. Further, the upper insulation plate projection fits in the recess or through-hole formed between the groove structures and extends lower than the bus bars. Therefore, it is possible to prevent leak currents from being generated between the low-voltage bus bar and the high-voltage bus bar or between two high-voltage bus bars.

While the invention has been described in conjunction with the exemplary embodiments described above, many equivalent modifications and variations will be apparent to those skilled in the art when given this disclosure. Accordingly, the exemplary embodiments of the invention set forth above are considered to be illustrative and not limiting. Various changes to the described embodiments may be made without departing from the spirit and scope of the invention.

What is claimed is:

1. An electrical connection box, comprising:
   a first bus bar to which a first voltage may be applied and a second bus bar to which a second voltage not lower than said first voltage may be applied;
   a first insulation plate on which both said first and second bus bars are mounted; and a second insulation plate superimposed on said first insulation plate, wherein said first insulation plate provides, at least at a region where said first and second bus bars are adjacent, groove structures in which said first and second bus bars are respectively received, each said groove structure being defined by a base wall surface on which the respective bus bar is disposed and a pair of opposed upstanding side wall surfaces, and said first insulation plate further provides a concavity in the form of a downward recess or a through-hole located between said groove structures, and said second insulation plate having a downward projection received in said concavity, said downward projection having a lower end which is located at a level lower than said base wall surface of said groove structure.

2. An electrical connection box according to claim 1 wherein said concavity is elongate and said downward projection is an elongate downwardly projecting wall.

3. An electrical connection box according to claim 1 wherein said second insulation plate closes said groove structures of said first insulation plate so as to form closed air insulation zones containing said first and second bus bars.

4. An electrical connection box according to claim 1 wherein said first insulation plate has a planar plate portion and pairs of upstanding walls defining, with said planar plate portion, said groove structures.

5. An electrical connection box according to claim 1 wherein said first insulation plate comprises a planar plate portion having grooves in a first main surface thereof, constituting said groove structures.

6. An electrical connection box according to claim 5 wherein said grooves of said first insulation plate each have, where they are adjacent each other, a deeper portion of depth greater than at least one other portion thereof, said first and second bus bars having respectively downwardly stepped portions received in said deeper portions.

7. An electrical connection box according to claim 1 wherein said first voltage is one of about 14V and about 28V.

8. An electrical connection box according to claim 1 wherein the voltage applied to the second bus bar does not exceed about 200V.

9. A vehicle having an electrical connection box, comprising:
a first bus bar to which a first voltage may be applied and a second bus bar to which a second voltage not lower than said first voltage may be applied;
a first insulation plate on which both said first and second bus bars are mounted; and
a second insulation plate superimposed on said first insulation plate, wherein said first insulation plate provides, at least at a region where said first and second bus bars are adjacent, groove structures in which said first and second bus bars are respectively received, each said groove structure being defined by a base wall surface on which the respective bus bar is disposed and a pair of opposed upstanding side wall surfaces, and said first insulation plate further provides a concavity in the form of a downward recess or a through-hole located between said groove structures, and said second insulation plate having a downward projection received in said concavity, said downward projection having a lower end which is located at a level lower than said base wall surface of said groove structure.

10. A vehicle according to claim 9 wherein said concavity is elongate and said downward projection is an elongate downwardly projecting wall.

11. A vehicle according to claim 9 wherein said second insulation plate closes said groove structures of said first insulation plate so as to form closed air insulation zones containing said first and second bus bars.

12. A vehicle according to claim 9 wherein said first insulation plate has a planar plate portion and pairs of upstanding walls defining, with said planar plate portion, said groove structures.

13. A vehicle according to claim 9 wherein said first insulation plate comprises a planar plate portion having grooves in a first main surface thereof, constituting said groove structures.

14. A vehicle according to claim 13 wherein said grooves of said first insulation plate each have, where they are adjacent each other, a deeper portion of depth greater than at least one other portion thereof, said first and second bus bars having respectively downwardly stepped portions received in said deeper portions.

15. An electrical connection box according to claim 8 wherein said first voltage is one of about 14V and about 28V.

16. A vehicle according to claim 9 wherein the voltage applied to the second bus bar does not exceed about 200V.

* * * * *